(12) United States Patent
Lin et al.

(10) Patent No.: US 11,332,826 B1
(45) Date of Patent: May 17, 2022

(54) ATOMIC LAYER DEPOSITION EQUIPMENT AND PROCESS METHOD

(71) Applicant: SKY TECH INC., Hsinchu County (TW)

(72) Inventors: Jing-Cheng Lin, Hsinchu County (TW); Ta-Hao Kuo, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 0 days.

(21) Appl. No.: 17/111,063

(22) Filed: Dec. 3, 2020

(51) Int. Cl.
*C23C 16/455* (2006.01)
*H01L 21/02* (2006.01)

(52) U.S. Cl.
CPC .... *C23C 16/45536* (2013.01); *H01L 21/0228* (2013.01); *C23C 16/45525* (2013.01); *C23C 16/45544* (2013.01)

(58) Field of Classification Search
CPC ........................ C23C 16/4412; C32C 16/45554
See application file for complete search history.

(56) References Cited

U.S. PATENT DOCUMENTS

| 2003/0000647 | A1* | 1/2003 | Yudovsky | C23C 16/4585 156/345.51 |
| 2005/0208217 | A1* | 9/2005 | Shinriki | C23C 16/34 427/248.1 |
| 2007/0089670 | A1* | 4/2007 | Ikedo | C23C 16/4585 118/50 |
| 2009/0239362 | A1* | 9/2009 | Hirata | C23C 16/4584 438/509 |

\* cited by examiner

*Primary Examiner* — Joseph A Miller, Jr.
(74) *Attorney, Agent, or Firm* — Chun-Ming Shih; HDLS IPR Services

(57) ABSTRACT

An atomic layer deposition equipment and an atomic layer deposition process method are disclosed. The atomic layer deposition equipment includes a chamber, a heater, a support unit, a hollow component, a bottom pumping port, and a shower head component, wherein the support unit is disposed on the top surface of the heater for supporting a substrate. There is an upper exhaust path formed between the hollow component and the support unit for exhausting process fluid such as precursors, so that the flow field of the process fluid in the atomic layer deposition process can be adjusted stably to make a uniform deposition on the substrate.

7 Claims, 7 Drawing Sheets

ATOMIC LAYER DEPOSITION EQUIPMENT AND PROCESS METHOD

TECHNICAL FIELD

This present disclosure relates to an atomic layer deposition equipment and an atomic layer deposition process method, more particularly, to an atomic layer deposition equipment and an atomic layer deposition process method that regulate the flow field of the process fluid through an upper exhaust path which is formed between a hollow component and a support unit.

BACKGROUND

The integrated circuit (IC) technology has matured, and the current development trend is to make electronic products more lightweight, high-performance, high-reliability and intelligent. The technology to miniaturize transistors of electronic products is very important. The size of the transistor is crucial to the performance of the electronic product. In electronic products, smaller transistors can reduce current transmission time and reduce energy consumption, so as to quickly calculate and achieve energy-saving effects. At present, in the tiny transistors, some of the key thin film layers are almost only a few atoms thick, and one of the techniques to develop these microstructures is the atomic layer deposition process (ALD process).

The ALD process allows the substance to be deposited layer by layer on the surface of the substrate in the form of single atoms, wherein the process allows the precursor to be chemically adsorbed on the surface of the substrate or on the material surface of the previous film, thereby producing a uniform and thin film. In the ALD process, depositing uniform thin films is an important foundation of transistor scaling and so an important topic in the development of transistors is how to effectively control the uniformity of the thin film.

At present, in the ALD process, it is still hard to effectively control the uniformity of the deposited film. One of the problems is that the flow field of the precursor is not properly controlled (for example, how to pump the precursor out of the chamber without affecting the uniformity of the substrate in the deposition process). Most ALD equipment has a large closed chamber. During the ALD process, the chamber can contain a large number of precursors, and the precursors are retained in the chamber to contact the substrate for deposition. The closed chamber can avoid the loss of precursors before the deposition and the reaction are completed. When the deposition and the reaction are complete, the precursors in the chamber are exhausted through the pumping port at the bottom of the chamber.

However, in the ALD process, if such a large closed chamber is used, the amount of precursors will be large, resulting in excessive costs. Furthermore, if the time to pump out the precursors is not well controlled, when the precursors are pumped out through a single pumping device (bottom pumping port), the precursors may not flow steadily, resulting in poor uniformity of the deposited substrate.

In order to reduce costs, one of the methods is to reduce the volume of the chamber to reduce the amount of precursors. However, this method will cause the precursors to form a turbulent flow, causing the precursors to repeatedly contact the substrate and reduce the uniformity of the substrate. Therefore, how to reduce the cost and control the uniformity of the precursor deposition on the substrate are issues to be overcome in the current ALD process.

SUMMARY

Therefore, to overcome the deficiencies in the conventional technology, an object of the present disclosure is to provide an atomic layer deposition equipment and an atomic layer deposition process method, which can control a precursor and/or a purge gas to form a slow flow field, so as to adjust the uniformity of a substrate when the precursor is deposited on the substrate.

It is then an object of the present disclosure to provide an atomic layer deposition equipment. The atomic layer deposition equipment includes a chamber, a heater, a support unit, at least one hollow component, at least one bottom pumping port, and a shower head component. The chamber includes a containing space. The heater is disposed in the containing space of the chamber and has a top surface. The support unit is disposed on the top surface of the heater and has a base plate and a protruding portion, wherein the protruding portion is connected to an upper surface of the base plate and the base plate is used to support a substrate. The hollow component includes at least one exhaust hole and is fluidly connected to the containing space of the chamber, wherein the hollow component is disposed above the support unit, and there is an upper exhaust path formed between the support unit and the hollow component. The bottom pumping port is fluidly connected to the containing space of the chamber and is connected to a pump, and the bottom pumping port is used to exhaust at least one fluid in the containing space. The shower head component is fluidly connected to the containing space of the chamber, and is used to provide at least one precursor or a purge gas into the chamber.

It is another object of the present disclosure to provide an atomic layer deposition process method. The atomic layer deposition process method includes: pumping out a fluid from the containing space of the chamber through the bottom pumping port; providing a precursor into the containing space of the chamber for the precursor to react with a substrate on the support unit; stopping providing the precursor into the containing space of the chamber; providing a purge gas into the containing space of the chamber, and pumping out the precursor from the containing space of the chamber through the upper exhaust path formed between the hollow component and the support unit to remove the precursor; and stopping providing the purge gas into the containing space of the chamber before stopping pumping out the precursor from the containing space of the chamber through the upper exhaust path.

It is yet another object of the present disclosure to provide an atomic layer deposition process method. The atomic layer deposition process method includes: pumping out a fluid from the containing space of the chamber through the bottom pumping port, and pumping out the fluid from the containing space of the chamber through the upper exhaust path formed between the hollow component and the support unit, wherein pumping out the fluid from the containing space of the chamber through the upper exhaust path is continuous during the atomic layer deposition process; providing a precursor into the containing space of the chamber for the precursor to react with the substrate on the support unit; stopping providing the precursor into the containing space of the chamber; providing a purge gas into the containing space of the chamber; and stopping providing the purge gas into the containing space of the chamber while continually pumping out the precursor from the containing space of the chamber through the upper exhaust path.

Optionally, the atomic layer deposition equipment further includes a fixation member connected to the heater and the support unit and is used to fasten the support unit to the heater.

Optionally, the base plate of the support unit is a disc and the protruding portion is a protruded ring, wherein a diameter of the protruded ring is smaller than a diameter of the disc.

Optionally, the protruding portion corresponds to the exhaust hole of the hollow component.

Optionally, the exhaust hole is located at a bottom of the hollow component.

Optionally, the atomic layer deposition equipment further includes a lifting device connected to the heater, and is used to drive the heater and the support unit toward or away from the hollow component, so as to adjust a first distance between the hollow component and the support unit.

In short, the present disclosure provides an atomic layer deposition equipment and an atomic layer deposition process method which can form a slow flow field of the precursor and/or the purge gas by the upper exhaust path formed between the hollow component and the support unit, and the precursor and/or the purge gas can be pumped out from the hollow component. Thus, the precursor can be reacted with and deposited on the substrate in a dynamic manner, and the uniformity of the deposition on the substrate in the atomic layer deposition process is further regulated. Therefore, the atomic layer deposition equipment and the atomic layer deposition process method of the present disclosure have competitive advantage in the market that requires ALD process (such as IC industry).

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

According to embodiments of the present disclosure, an atomic layer deposition equipment and a process method using the same are provided. The atomic layer deposition equipment not only has a bottom pumping port connected to a chamber, but also has an upper exhaust path formed between a hollow component and a support unit, wherein the upper exhaust path can cause the excess precursor to be pumped out of the chamber. Thus, the atomic layer deposition equipment of the present disclosure is different from the deposition equipment of the prior art which only removes the excess precursor through the bottom pumping port. The structural design of the support unit allows the excess precursor to form a stable slow flow, which in turn contributes to the uniformity of the precursor deposition on the substrate.

Moreover, the flow of the precursor guided by the upper exhaust path can be modulated by driving a heater and the support unit toward or away from the hollow component through a lifting device, so as to adjust a first distance between the hollow component and the support unit, and the deposition of precursors to be reacted with the substrate can be further controlled to optimize the uniformity of the deposition on the substrate.

Figure 1:
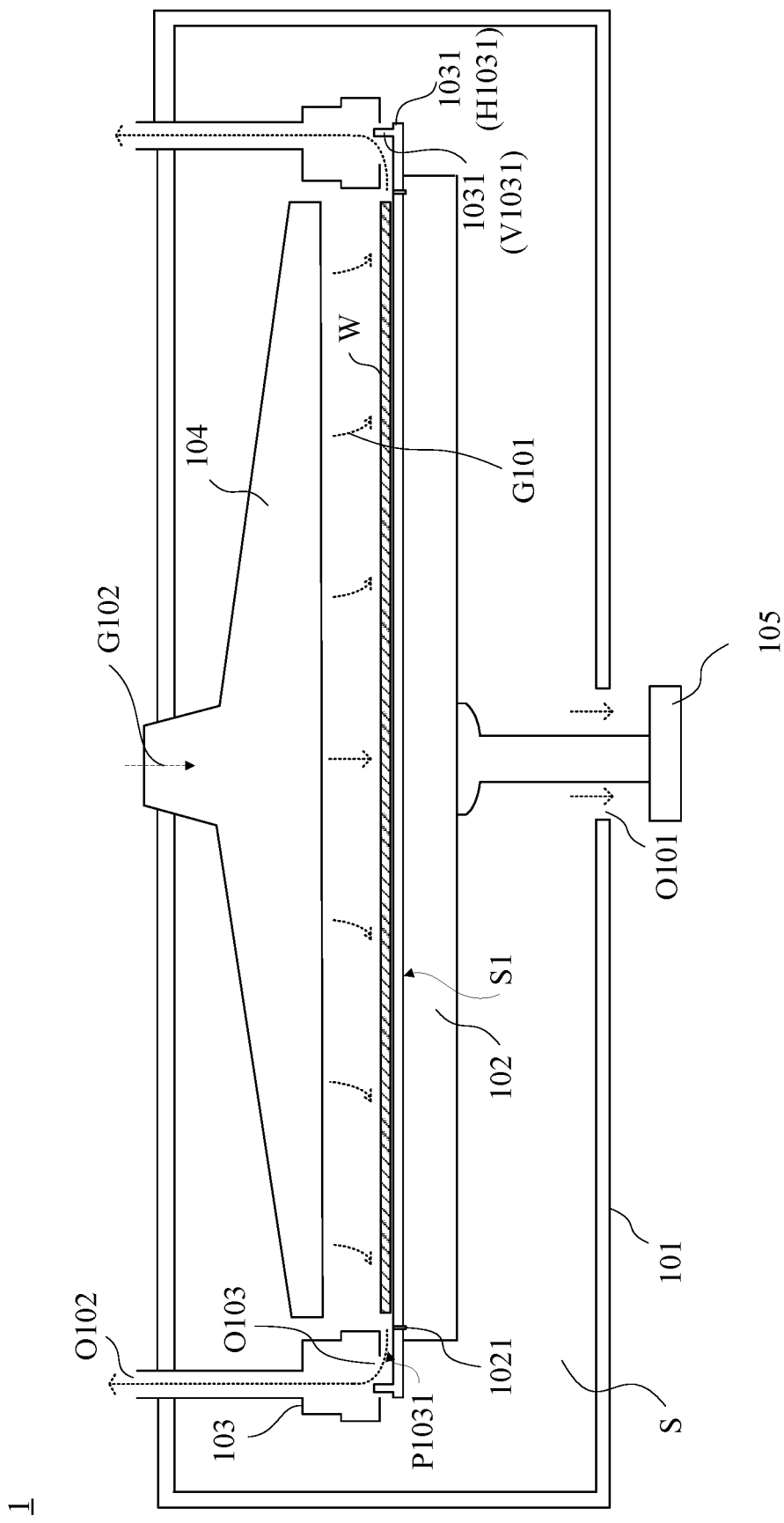
FIG. 1 is a schematic diagram of an atomic layer deposition equipment according to an embodiment of the present disclosure.

FIG. 1 is a schematic diagram of an atomic layer deposition equipment according to an embodiment of the present disclosure. Referring to FIG. 1, the atomic layer deposition equipment 1 has a chamber 101, at least one bottom pumping port O101, a heater 102, a support unit 1031, multiple hollow components 103, and a shower head component 104. The chamber 101 has a containing space S, and the bottom pumping port O101 is fluidly connected to the containing space S of the chamber 101, wherein the bottom pumping port O101 can connect to a power device (for example, a pump) to form a bottom pumping device to pump out at least one fluid in the containing space S.

The heater 102 is disposed in the containing space S of the chamber 101 and has a top surface S1, and the support unit 1031 is disposed on the top surface S1 of the heater 102. A fixation member 1021, like a screw, is used to connect and fasten the support unit 1031 to the heater 102.

The support unit 1031 has a base plate H1031 and a protruding portion V1031. The protruding portion V1031 is connected to an upper surface of the base plate H1031 and the base plate H1031 is used to support a substrate W (for example, but not limited to a wafer).

Figure 2:
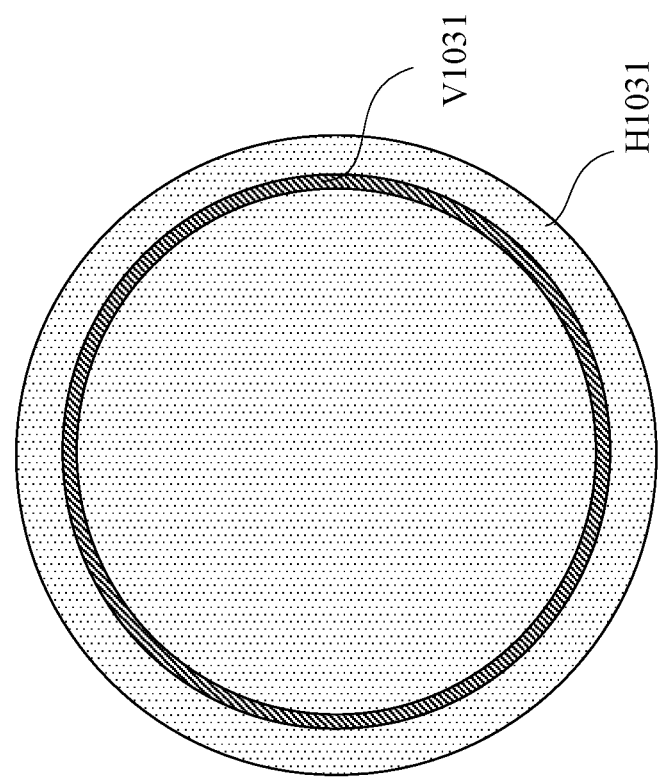
FIG. 2 is a top view of a support unit according to an embodiment of the present disclosure.

Referring to FIG. 2, which is a top view of the support unit according to an embodiment of the present disclosure, the base plate H1031 of the support unit 1031 is a disc and the protruding portion V1031 is a circular protruded ring, wherein a diameter of the protruded ring is smaller than a diameter of the disc. In other embodiments, the base plate H1031 is a polygonal plate, and the protruding portion V1031 is composed of a plurality of protrusions configured in a continuous or discontinuous arrangement.

Figure 4:
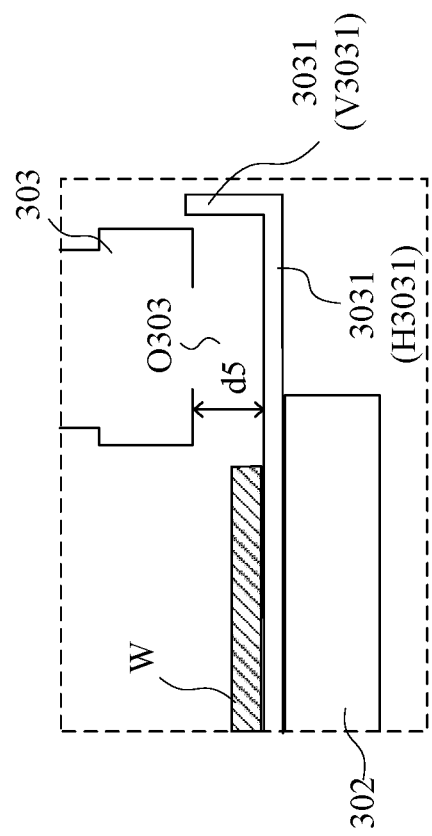
FIG. 4 is a schematic diagram illustrating a part of an atomic layer deposition equipment according to yet another embodiment of the present disclosure.
Figure 3:
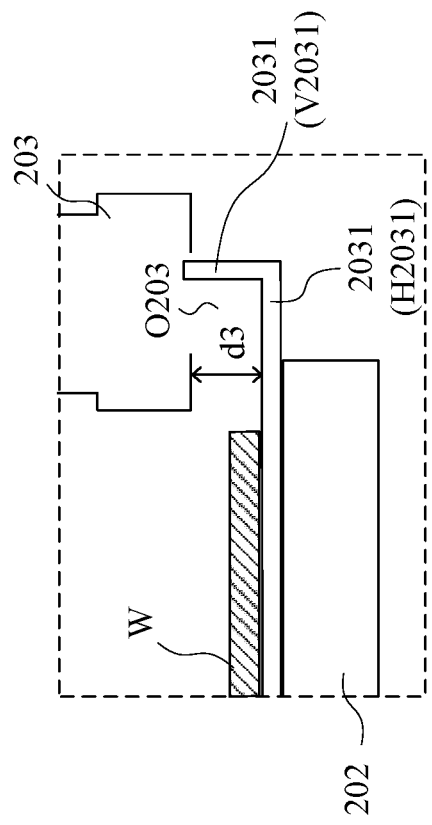
FIG. 3 is a schematic diagram illustrating a part of an atomic layer deposition equipment according to another embodiment of the present disclosure.

Shown as other embodiments in FIG. 3 and FIG. 4, when the base plate H2031, H3031 and the protruding portion V2031, V3031 of the support unit 2031, 3031 are respectively a disc and a circular protruded ring, the diameter of the protruded ring can be equal to the diameter of the disc. Or, when the base plate H2031, H3031 is not a disc and the protruding portion V2031, V3031 is not a circular protruded ring, the protruding portion V2031, V3031 is flush with the base plate H2031, H3031.

Referring back to FIG. 1, the hollow component 103 is fluidly connected to the containing space S of the chamber 101 and is disposed above the support unit 1031. The hollow component 103 has at least one exhaust hole O103, a top opening O102, and a hollow section penetrating the exhaust hole O103 and the top opening O102, wherein the hollow section can be connected to the outside. There are no limitations on the hollow path of the hollow section.

In specific, the exhaust hole O103 is located at the bottom of the hollow component 103 and the protruding portion V1031 of the support unit 1031 corresponds to the exhaust hole O103 of the hollow component 103. In other embodiments, the exhaust hole O103 is located at the side of the hollow component 103 and the protruding portion V1031 of the support unit 1031 also corresponds to the exhaust hole O103 of the hollow component 103.

In the embodiment shown in FIG. 4, the protruding portion V3031 of the support unit 3031 does not correspond to the exhaust hole O303 at the bottom of the hollow component 303, and the protruding portion V3031 of the support unit 3031 surrounds and is located below the hollow component 303. In other embodiments, the protruding portion V3031 of the support unit 3031 does not correspond to the exhaust hole O303 at the side of the hollow component 303, and the protruding portion V3031 of the support unit 3031 surrounds the hollow component 303 and the exhaust hole O303.

The shower head component 104 is fluidly connected to the containing space S of the chamber 101, and is used to provide a precursor or a purge gas into the chamber 101.

Referring back to FIGS. 1 to 3, the support unit 1031, 2031, 3031 and the hollow component 103, 203, 303 form an upper exhaust path P1031 in the atomic layer deposition process. More specifically, a small region of space is formed between the support unit 1031, 2031, 3031 and the hollow component 103, 203, 303, and unreacted precursor G101 in the atomic layer deposition process is pumped out slowly by a pump connected to the hollow component 103, 203, 303. Hence, the precursor G101 forms a steady/stable slow flow field and most of the unreacted precursor G101 is pumped out by the hollow component 103, 203, 303. In one embodiment, the hollow component 103, 203, 303 can connect to a power device (for example, a pump) through the top opening O102 to form an upper pumping device.

The small region of space formed by the support unit 1031, 2031, 3031, and the hollow component 103, 203, 303 provides a small reaction zone for the precursor G101 and the substrate W, so as to reduce the usage of precursor G101, and thereby lowering the cost. In addition, the small reaction zone reduces the turbulent flow affecting the precursor G101 and thus the precursor G101 can be pumped out slowly and steadily by the hollow component 103, 203, 303. Hence, the uniformity of the substrate W after being deposited with the precursor G101 is improved.

There is an adjustable first distance d3, d5 between the base plate H1031, H2031, H3031 of the support unit 1031, 2031, 3031 and the bottom of the hollow component 103, 203, 303. In specific, the atomic layer deposition equipment 1 further includes a lifting device 105. The lifting device 105 is connected to the heater 102 and drives the heater 102 and the support unit 1031, 2031, 3031 toward or away from the hollow component 103, 203, 303 to adjust the first distance d3, d5 between the hollow component 103, 203, 303 and the support unit 1031, 2031, 3031, and as such, the flow of the precursor G101 can be modulated in a more subtle manner.

Figure 5:
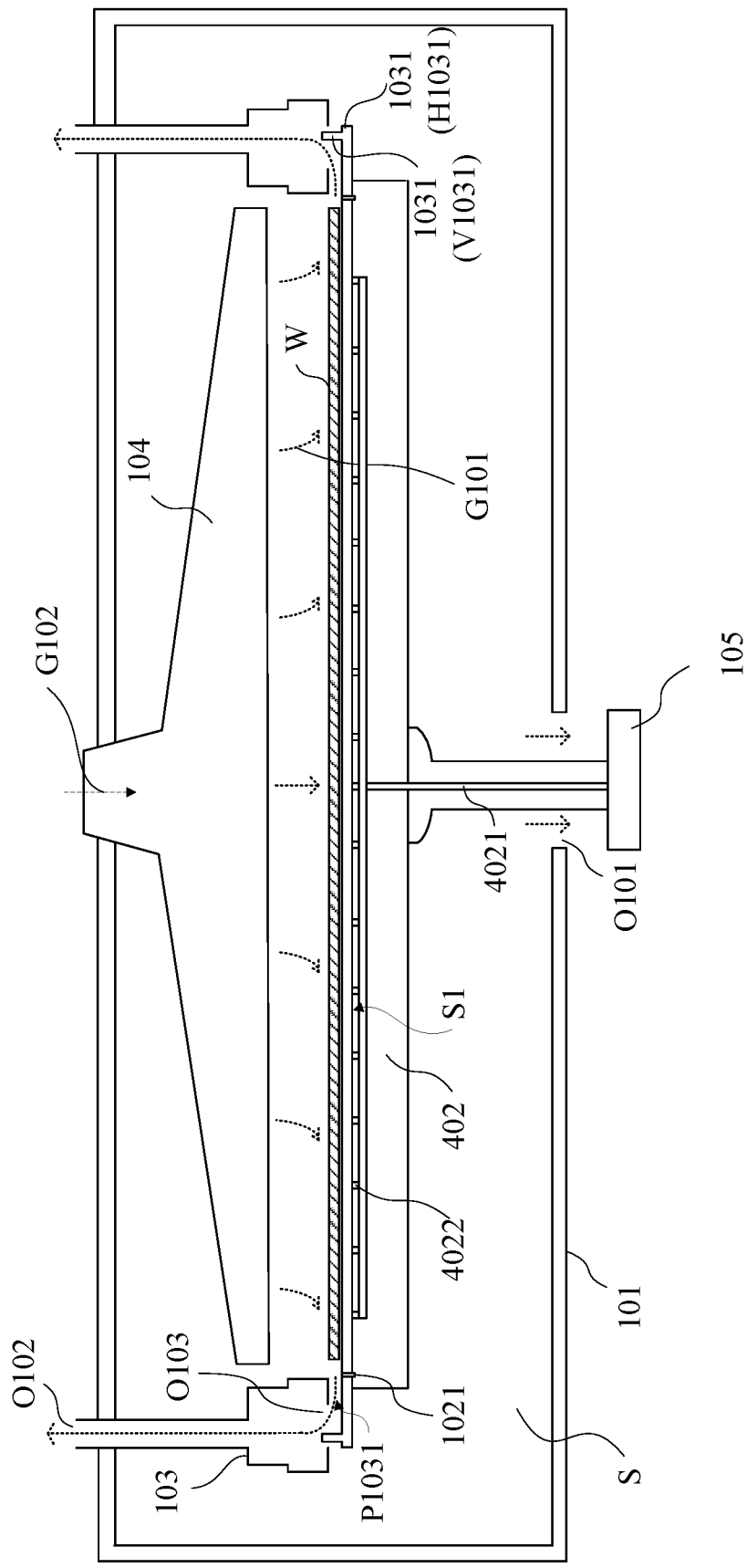
FIG. 5 is a schematic diagram of an atomic layer deposition equipment according to another embodiment of the present disclosure.
Figure 6:
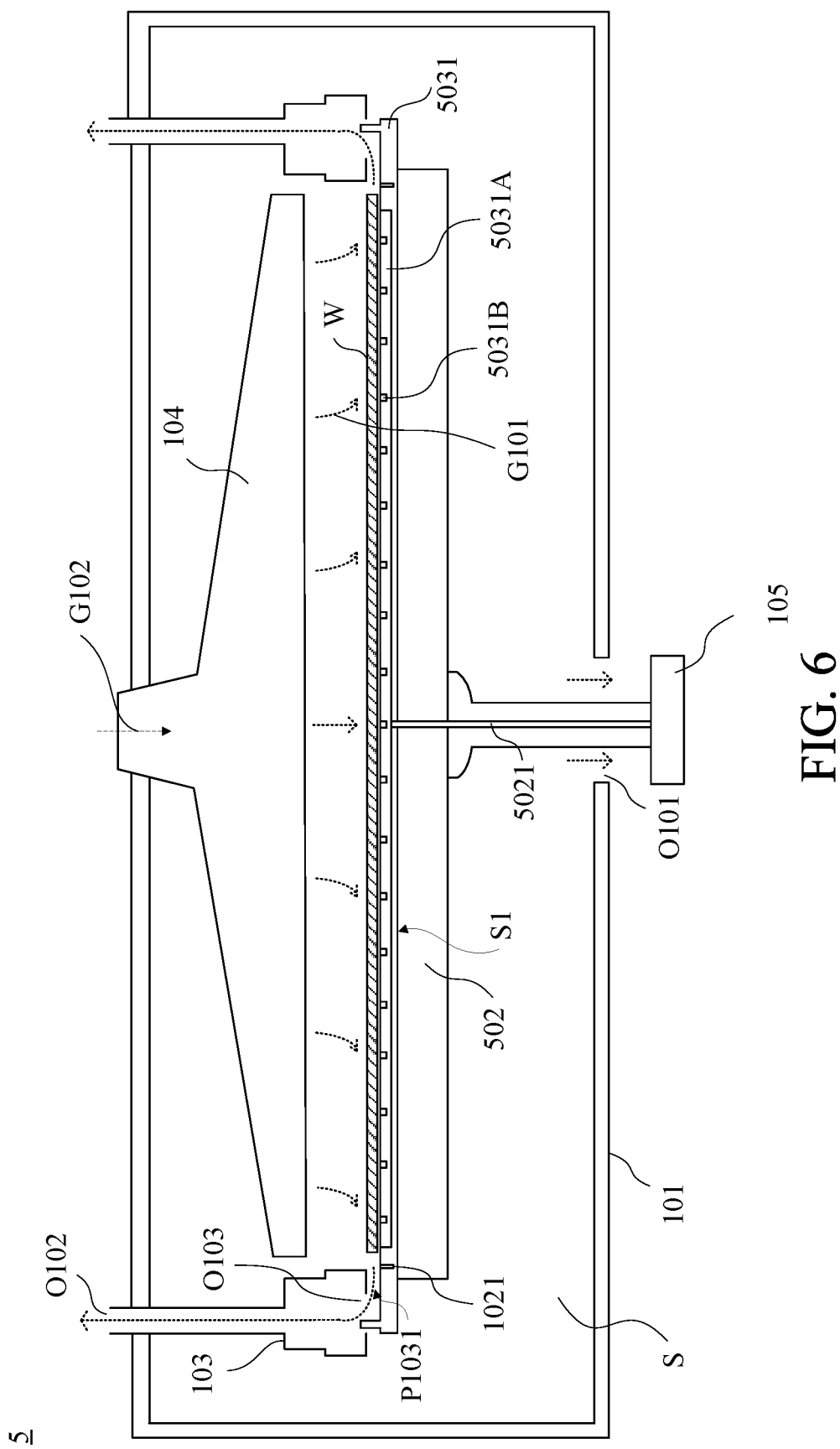
FIG. 6 is a schematic diagram of an atomic layer deposition equipment according to yet another embodiment of the present disclosure.

FIG. 5 and FIG. 6 illustrate another two embodiments of an atomic layer deposition equipment according to the present disclosure. Referring to FIG. 5, the atomic layer deposition equipment 4 is similar to the atomic layer deposition equipment 1 of FIG. 1 and the difference lies in that the heater 402 further includes a gas delivery pipeline 4021 and a plurality of trenches 4022. The plurality of trenches 4022 are disposed on the top surface S1 of the heater 402 in a radial pattern arrangement and are used to allow a gas, like argon, to be delivered by the gas delivery pipeline 4021 and passed through the trenches 4022 to between the heater 402 and the support unit 1031, so as to ensure a uniform temperature throughout the support unit.

In the embodiment shown in FIG. 6, the heater 502 of the atomic layer deposition equipment 5 further includes a gas delivery pipeline 5021 fluidly connected to the support unit 5031, and the support unit 5031 of the atomic layer deposition equipment 5 further includes a gas delivery passage 5031A and a plurality of trenches 5031B disposed on the upper surface, wherein the trenches 5031B are arranged in a radial pattern. Through the gas delivery pipeline 5021, the gas delivery passage 5031A, and the trenches 5031B, a gas, like argon, is delivered to between the support unit 5031 and the substrate W, so as to ensure a uniform temperature is maintained throughout the substrate W.

Figure 7:
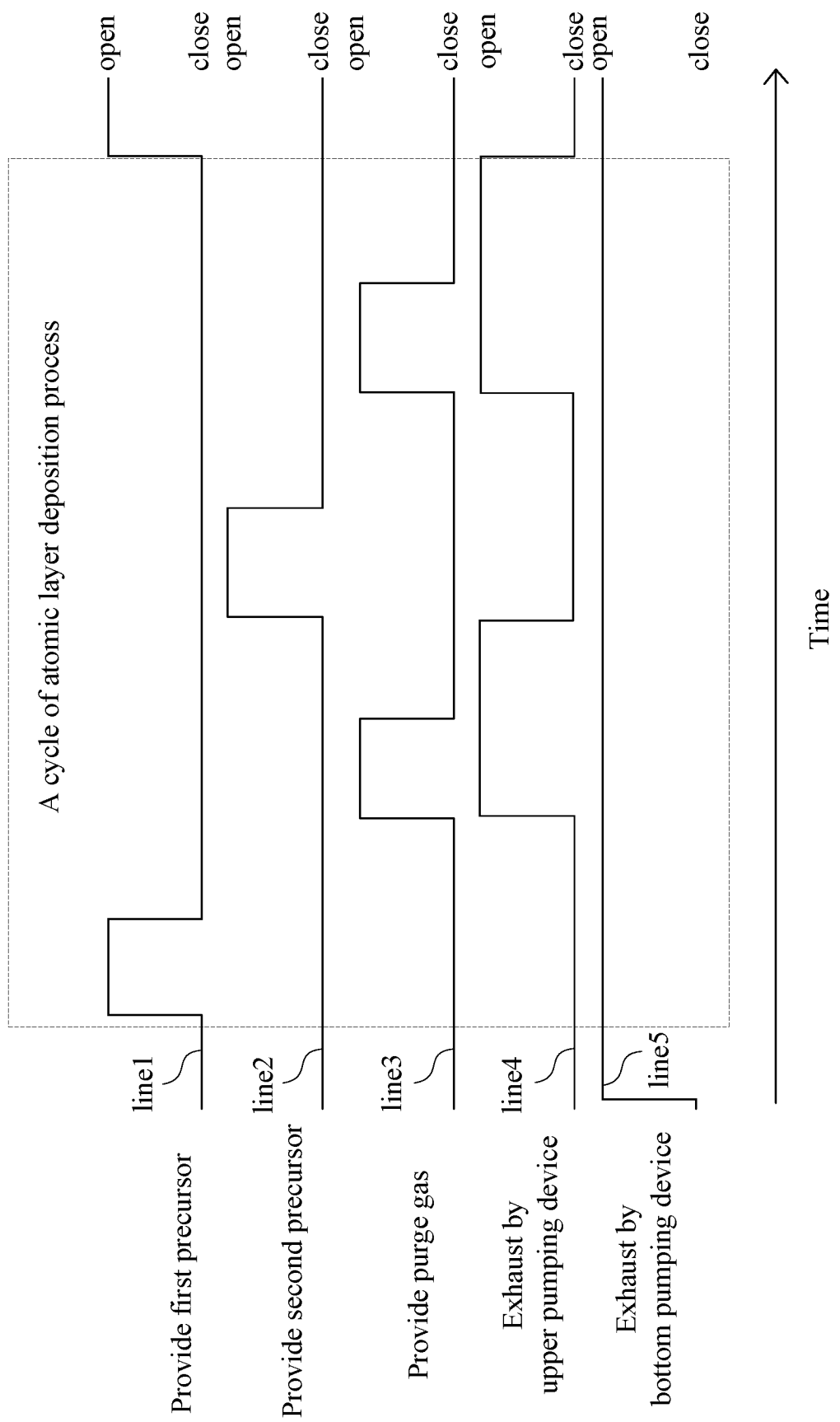
FIG. 7 is a trend chart illustrating steps of an atomic layer deposition process in relation to time according to an embodiment of the present disclosure.

Now, referring to FIG. 7 to realize the method of the atomic layer deposition process. FIG. 7 is a trend chart illustrating steps of an atomic layer deposition process in relation to time according to an embodiment of the present disclosure.

First, referring to line5, after a substrate W is placed on the support unit 1031, the bottom pumping device of the atomic layer deposition equipment 1 is used to pump out a fluid from the containing space S of the chamber 101 through the bottom pumping port O101 of the chamber 101 and the pumping continues throughout the atomic layer deposition process.

Next, referring to line1, a first precursor G101 is provided to the containing space S of the chamber 101 by the shower head component 104, and the first precursor G101 diffuses to the substrate W to react with and deposit on the material on the surface of the substrate W.

After the target amount of the first precursor G101 is reached (the target amount is determined according to the process parameters), the shower head component 104 stop providing the first precursor G101 into the containing space S of the chamber 101.

Subsequently, referring to line3 and line4, after the first precursor G101 is stop being provided into the containing space S of the chamber 101, the purge gas G102 (such as but not limited to nitrogen) is provided from the shower head component 104 to the containing space S of the chamber 101 to purge the first precursor G101. At the same time, the upper exhaust path P1031 formed between the hollow component 103 and the support unit 1031 is used to pump out the first precursor G101.

Specifically, most of the first precursor G101 exists in the small reaction zone created by the hollow component 103 and the support unit 1031, and is slowly pumped out by the pump connected to the hollow component 103 so that the flow field of the first precursor G101 is slow. Hence, the first precursor G101 is able to react with and deposit on the substrate W in a dynamic manner. Also, the flow field of the purge gas G102 can be stably controlled.

When the first precursor G101 and the purge gas G102 in the chamber 101 flow slowly, their flow fields can be stably controlled and the occurrence of turbulent flow can be avoided, so as to improve and fine control the uniformity of the atomic layer deposition on the substrate W.

Then, referring to line3 and line4, when the providing of the purge gas G102 into the containing space S of the chamber 101 is stopped, the pumping of the precursor G101 from the containing space S of the chamber 101 through the upper exhaust path P1031 continues for a while and then is stopped.

In one embodiment, the time of pumping out the precursor G101 from the containing space S of the chamber 101 through the upper exhaust path P1031 is longer than the time of providing the purge gas G102, but there is no limitation thereto. The time of pumping out the precursor G101 from the containing space S of the chamber 101 through the upper exhaust path P1031 can also be equal to the time of providing the purge gas G102.

Further, referring to line2, the step of providing a second precursor is similar to the step of providing the first precursor. After the purge gas G102 is stopped from being provided to the chamber 101 for a period of time, and the pumping of the precursor G101 from the containing space S of the chamber 101 through the upper exhaust path P1031 is stopped, a second precursor is provided to the containing space S of the chamber 101 by the shower head component 104, and the second precursor diffuses to the substrate W to react and deposit with the material on the surface of the substrate W.

After the target amount of the second precursor is reached (the target amount is determined according to the process parameters), the shower head component 104 stops providing the second precursor into the containing space S of the chamber 101.

Further, referring to line3 and line4, after stop providing the second precursor into the containing space S of the chamber 101, the purge gas is provided from the shower head component 104 to the containing space S of the chamber 101 to purge the second precursor. At the same time, the upper exhaust path P1031 formed between the hollow component 103 and the support unit 1031 is used to pump out the second precursor from the containing space S of the chamber 101 to control the flow field of the second precursor and the purge gas.

Finally, the providing of the purge gas into the containing space S of the chamber 101 is stopped before the pumping of the second precursor from the containing space S of the chamber 101 through the upper exhaust path P1031 is stopped. It is to be noted that the fluid pumped out from the containing space S of the chamber 101 through the upper exhaust path P1031 could be different throughout the atomic layer deposition process in regards to different stages of the process, wherein the fluid could be air, purged gas, precursor, or prior to the beginning of the process, any substances remaining in the containing space S of the chamber 101.

In one embodiment, the time of pumping out the precursor from the containing space S of the chamber 101 through the upper exhaust path P1032 is longer than the time of providing the purge gas, but there is no limitation thereto. The time of pumping out the precursor from the containing space S of the chamber 101 through the upper exhaust path P1032 can also be equal to the time of providing purge gas.

After the first precursor and the second precursor are reacted with and deposited on the substrate W, one cycle of the atomic layer deposition process is completed, and the steps of each subsequent cycle are the same as the above.

Figure 8:
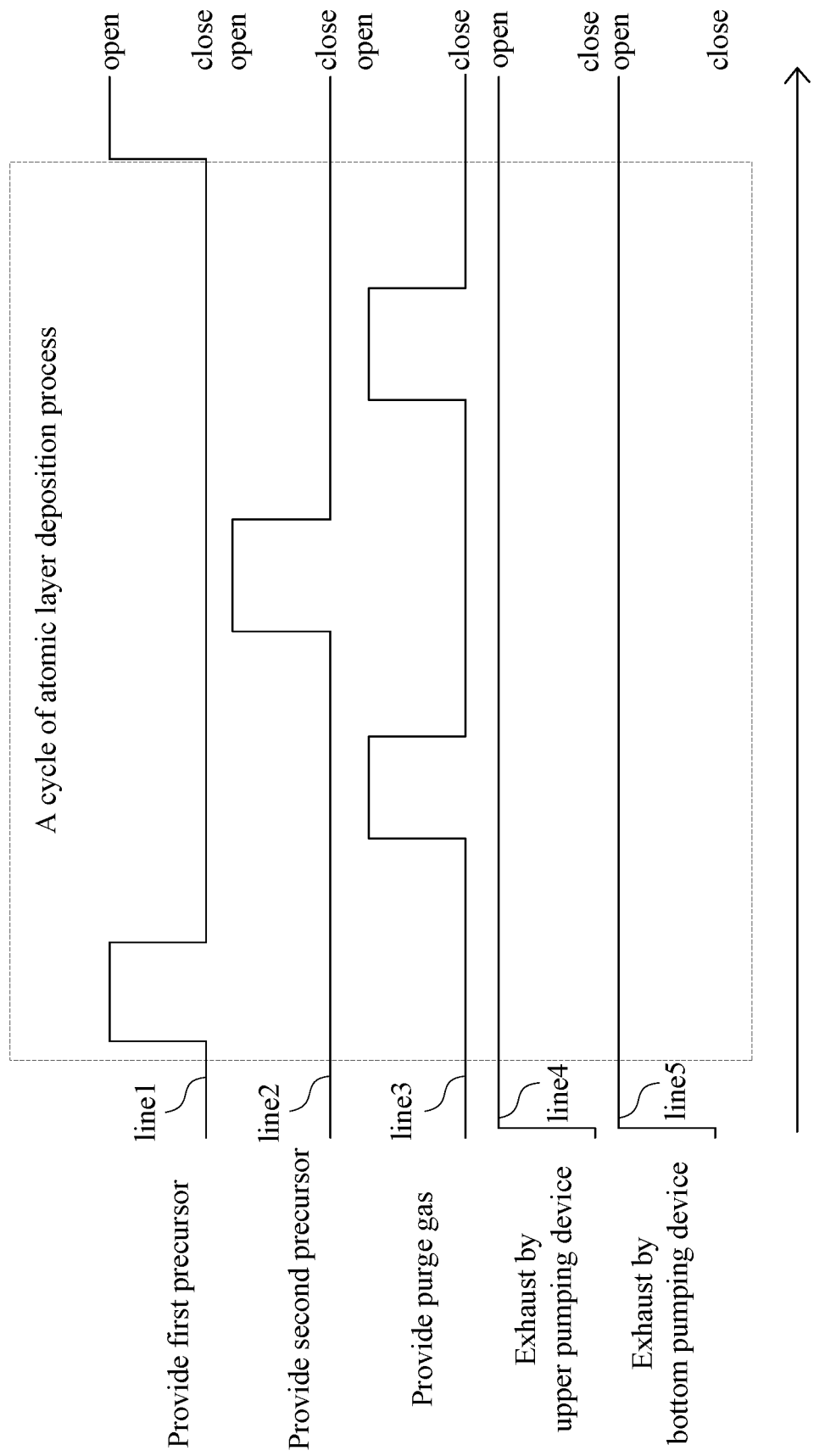
FIG. 8 is a trend chart illustrating steps of an atomic layer deposition process in relation to time according to another embodiment of the present disclosure.

Referring to FIG. 8 to realize another method of the atomic layer deposition process. FIG. 8 is a trend chart illustrating steps of an atomic layer deposition process in relation to time according to another embodiment of the present disclosure.

First, referring to line4 and line5, after the substrate W is placed on the support unit 1031, the bottom pumping device of the atomic layer deposition equipment 1 is used to pump out a fluid from the containing space S of the chamber 101 through the bottom pumping port O101 of the chamber 101 and the pumping continues throughout the atomic layer deposition process. Moreover, the upper exhaust path P1031 formed between the hollow component 103 and the support unit 1031 is used to pump out the fluid from the containing space S of the chamber 101, wherein pumping out the fluid from the containing space S of the chamber 101 through the upper exhaust path P1031 is continuous throughout the atomic layer deposition process.

Next, referring to line1, the first precursor G101 is provided into the containing space S of the chamber 101 by the shower head component 104, and the first precursor G101 diffuses to the substrate W to react and deposit with the material on the surface of the substrate W.

After the target amount of the first precursor G101 provided into the chamber 101 is reached (the target amount is determined according to the process parameters), the shower head component 104 stops providing the first precursor G101 into the containing space S of the chamber 101.

Further, after stop providing the first precursor G101 into the containing space S of the chamber 101, the purge gas G102 (such as but not limited to nitrogen) is provided from the shower head component 104 into the containing space S of the chamber 101 to purge the first precursor G101.

Finally, the providing of the purge gas G102 into the containing space S of the chamber 101 is stopped while the pumping of the precursor G101 from the containing space S of the chamber 101 through the upper exhaust path P1031 continues, so as to continually control the flow fields of the first precursor G101 and the purge gas G102. It is to be noted that the fluid pumped out from the containing space S of the chamber 101 through the upper exhaust path P1031 could be different throughout the atomic layer deposition process in regards to different stages of the process, wherein the fluid could be air, purged gas, precursor, or prior to the beginning of the process, any substances remaining in the containing space S of the chamber 101.

The step of providing the second precursor is similar to the step of providing the first precursor. After the first precursor and the second precursor are deposited on the substrate W, one cycle of the atomic layer deposition process is completed, and the steps of each subsequent cycle are the same as the above.

During the atomic layer deposition process, the heater 102 and the support unit 1031 can be driven toward or away from the hollow component 103 by a lifting device 105 to adjust the first distance between the support unit 1031 and the bottom of hollow component 103, so as to control the fluid flow in the process.

The effects of the atomic layer deposition equipment 1 and the process method using the same are shown in Table 1. Table 1 shows the wafer thickness of a 12-inch silicon wafer after the atomic layer deposition process. The thickness uniformity of the wafer is 0.34686, which is a good result after deposition.

TABLE 1

| Substrate: 12-inch silicon wafer | |
|---|---|
| thickness of wafer center | 19.80 nm |
| thickness of wafer right side | 19.81 nm |
| thickness of wafer left side | 19.97 nm |
| thickness of wafer bottom | 19.89 nm |
| thickness of wafer top | 19.88 nm |
| average thickness of wafer | 19.87 nm |
| Uniformity (U %) | 0.34686 |

In conclusion, the technical benefits of the atomic layer deposition equipment and process method of the present disclosure are described in the following.

In the conventional technology, in the atomic layer deposition process, a large amount of precursors are usually introduced into a large chamber to react with a substrate. Due to the large number of precursors being used, the cost is high. One conventional way to save cost is to reduce the volume of the chamber to reduce the amount of the precursors, but this method often causes the precursors to form turbulence in the chamber, resulting in poor uniformity of the substrate after deposition. On the contrary, the present disclosure provides an atomic layer deposition equipment and an atomic layer deposition process method that use small reaction zone formed by the hollow component and the support unit to save the usage of the precursors, and can form a stable, slow and uniform flow field of the precursor by using the upper pumping device to optimize the uniformity of the substrate after deposition.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

The invention claimed is:

1. An atomic layer deposition equipment comprising:
a chamber comprising a containing space;
a heater disposed in the containing space of the chamber and comprising a top surface;
a support unit disposed on the top surface of the heater, wherein the support unit comprises a base plate and a protruding portion connected to an upper surface of the base plate, wherein the upper surface of the base plate is used to support at least substrate, and the protruding portion is located around the substrate;
at least one hollow component comprising at least one exhaust hole and fluidly connected to the containing space of the chamber, wherein the hollow component is disposed above the support unit, and the exhaust hole of the hollow component faces the upper surface of the base plate, wherein the protruding portion extends form the upper surface of the base plate to the exhaust hole of the hollow component, and partial the protruding portion is located in the exhaust hole to form an upper exhaust path between the protruding portion of the support unit and the hollow component;
at least one bottom pumping port fluidly connected to the containing space of the chamber and connected to a pump, for exhausting at least one fluid in the containing space; and
a shower head component fluidly connected to the containing space of the chamber, for providing at least one precursor or a purge gas into the chamber, wherein a small region of space is formed by the support unit and the hollow component.

2. The atomic layer deposition equipment of claim 1, further comprising a fixation member connected to the heater and the support unit for fastening the support unit to the heater.

3. The atomic layer deposition equipment of claim 1, wherein the exhaust hole is disposed at a bottom of the hollow component.

4. The atomic layer deposition equipment of claim 1, wherein the hollow component further comprises a top opening and the top opening is connected to a pump.

5. The atomic layer deposition equipment of claim 1, wherein the heater further comprises a plurality of trenches disposed on the top surface and a gas delivery pipeline, for delivering a gas to between the heater and the support unit to ensure an uniform temperature throughout the support unit.

6. The atomic layer deposition equipment of claim 1, wherein the heater further comprises a gas delivery pipeline fluidly connected to the support unit, the support unit further comprises a gas delivery passage and a plurality of trenches disposed on the upper surface, for delivering a gas to between the support unit and the substrate to ensure an uniform temperature throughout the substrate.

7. The atomic layer deposition equipment of claim 1, wherein the base plate of the support unit is a disc, the protruding portion is a protruded ring, and a diameter of the protruded ring is equal to a diameter of the disc.

* * * * *